United States Patent [19]

Ramberg

[11] 3,990,082
[45] Nov. 2, 1976

[54] METHOD AND MEANS FOR RECORDING OF INFORMATION

[75] Inventor: Kjell Øystein Ramberg, Horten, Norway

[73] Assignee: Simrad A.S., Horten, Norway

[22] Filed: Mar. 19, 1975

[21] Appl. No.: 559,775

[30] Foreign Application Priority Data
Mar. 21, 1974 Norway.............................. 1012/74

[52] U.S. Cl............................... 346/1; 346/33 EC; 340/3 F
[51] Int. Cl.² ......................... G01D 9/00; G01S 9/66
[58] Field of Search.......... 346/33 R, 33 EC, 33 TP, 346/1, 23, 3 E, 3 F

[56] References Cited
UNITED STATES PATENTS
3,803,629  4/1974  Walsh et al. ...................... 346/33 R Primary Examiner—George H. Miller, Jr.
Attorney, Agent, or Firm—Watson, Cole, Grindle & Watson

[57] ABSTRACT

A method and means for recording auxiliary information, e.g. temperature readings, on echo sounder recorders or similar display devices, in addition to the normal recording, said information being presented as the distance of a recorded mark from a point of reference. In order to always secure a clear representation of such information, according to the invention the normal record on the display is blanked out or reduced in intensity adjacent said mark.

14 Claims, 2 Drawing Figures

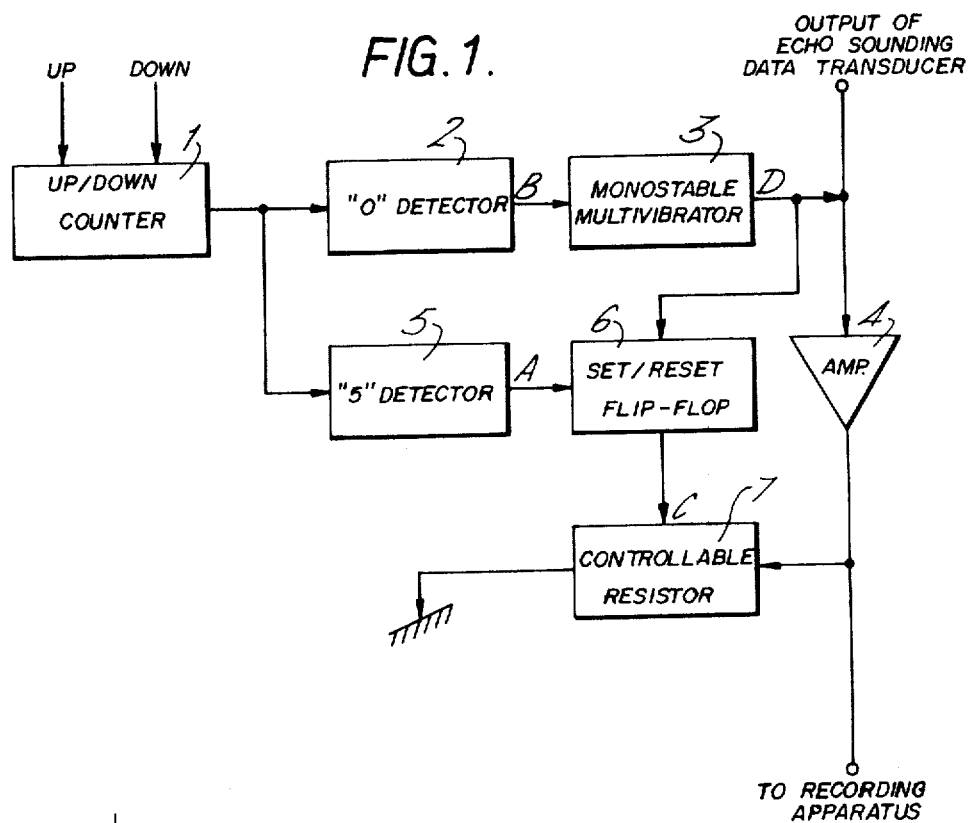
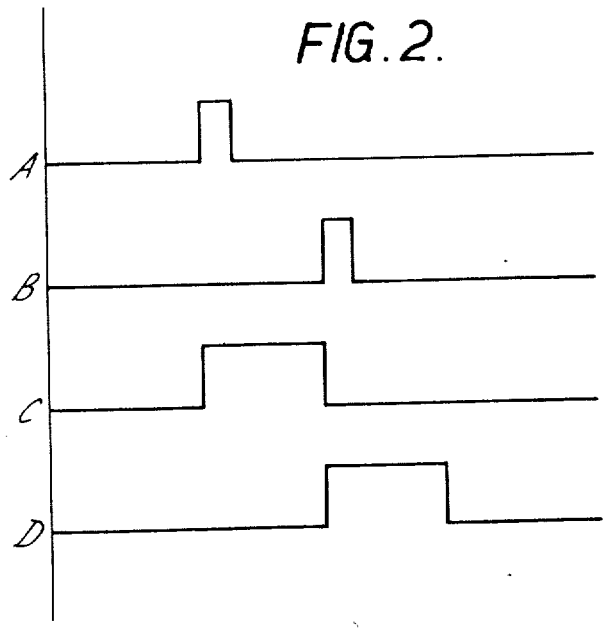

METHOD AND MEANS FOR RECORDING OF INFORMATION

The present invention relates to a method and means for recording auxiliary information on echo sounder recorders or corresponding display devices. In particular, the invention concerns recording information when the information is represented by the distance of a mark from a reference.

It is known to record information, e.g. temperature, on echo sounder recorders. The temperature is then indicated by a marker pulse supplied to the recorder, one for each ping, whereby after some time a line showing the temperature at the measuring site is built up. The temperature is read from a scale.

The temperature record is usually a black line. It may, however, be difficult to detect the line when it coincides with dark areas in the normal record. To prevent the lines from disappearing, it is known to replace the mark with a blank, whereby the black line is replaced by a white line. The white line appears because the otherwise dark record is discontinued or blanked out at the temperature line.

This method is comparatively complicated, as it is necessary to detect the signal level and to decide whether to mark or blank out before the line can be recorded. This must be repeated for each and every ping because the line is built up from individual points.

The invention provides a simple solution to the problem of marks disappearing in dark parts of the record. According to the invention the problem is solved by blanking out the normal record adjacent the marking. Thereby there will always be a black and a white line side by side. On completely white or lighter parts of the normal record the information record will appear as a black line. On dark parts of the normal record the white line will dominate visually. An example describing reading out and marking the results of temperature measurements on echo sounder recording is shown in the following with reference to the drawings where:

FIG. 1 shows a block diagram of the embodiment,
FIG. 2 is a pulse diagram for the embodiment in FIG. 1.

The temperature may, as described in Norwegian patent application No. 4510/73, be read into an UP/DOWN-counter 1. The number in the counter 1 represents the temperature, and when the temperature is to be recorded, the counter is counted down to zero. The operation of such counters is well known in the art.

The output from the UP/DOWN-counter 1 is connected to the input of a 0-detector 2 which itself controls a monostable multivibrator 3. The monostable multivibrator 3 supplies a pulse to the signal path between the echo sounder transducer and the recorder. The pulse is amplified by an amplifier 4. The output from the UP/DOWN-counter 1 is also connected to the input of a 5-detector 5. The output from the 5-detector 5 is connected to the set input of set/reset. (RS) flip-flop 6. The reset input of the RS flip-flop 6 is connected to the output of the monostable mutivibrator 3. The output from the RS flip-flop 6 controls a controllable resistor 7 which is connected between the output of the amplifier 4 and ground.

When the counter 1 is counted down towards zero, the 5-detector 5 will detect that five more steps are left in the counter 1 and send out a pulse A. The pulse A sets the RS flip-flop 6, whereby output C goes high. The resistance of the controllable resistor 7 is then reduced and the signals from amplifier 4 are effectively conducted to ground.

When the counter 1 has counted down to zero, pulse B on the output of the 0-detector 2 triggers the monostable multivibrator 3 whereby output D goes high for a period of time determined by the time constant of multivibrator 3. Output D resets the RS flip-flop 6 and output C goes low. The signal path between the amplifier 4 and the recorder is then no longer grounded. The output D from flip-flop 6 is also fed through the input of the amplifier 4.

The end result is that as long as C is high the signal path to the recorder is blocked, whilst signal D makes a strong mark on the paper. It is particularly advantageous to let the 5-detector 5 control the blanking of amplifier 4, whereby a white line is recorded before a black. The exact reference point of the data recording is the border between the white blank and the black mark. When the white blank is recorded first, the pen will not drag carbon dust along and make the border between blanks and marks undefined. In addition, when used on echo sounders with the well known white line feature one will not mistake one record for the other when the data record is close to the seabed record, because when the white line feature is being used, the seabed is recorded as a thin black line followed by a white field.

The invention is not limited to the embodiment shown. Then blank may for instance be located behind the mark in the direction of motion of the pen, or on both sides of the mark.

The invention may also be worked using analogue circuits where, for instance, the counter is replaced by a capacitor which is being discharged, and the 0-detector 2 and the 5-detector 5 are replaced by Schmitt triggers of different threshold level.

It will not always be necessary to completely blank out the normal recording. In many cases it will be sufficient to reduce the normal recording intensity to make the information record visible. Other kinds of data may be recorded.

Examples are:
Salinity, ocean current velocity, the catch in a trawl.
Although only one embodiment of the invention has been illustrated and described in detail various changes may be made without departing from the scope of the invention.

I claim:
1. A method for controlling the recording of auxiliary information on a recording medium along with echo sounding signals, comprising the steps of:
 storing data representative of said auxiliary information;
 changing the value of the stored data;
 detecting a first predetermined value of the stored data and generating a first signal indicative thereof;
 detecting a second predetermined value of the stored data and generating a second signal indicative thereof;
 generating a marking signal representative of said auxiliary information in response to said second signal;
 amplifying said marking signal and the echo sounding signals for recording;
 reducing the amplitude of the echo sounding signals in response to said first signal; and restoring the amplitude of said echo sounding signals after a period determined by the interval between said first and second signals, whereby said marking signal is recorded on said recording medium and the normal record adjacent said marking signal provides a contrasting background thereto.

2. A method as in claim 1 wherein said first signal precedes said second signal whereby the intensity of the normal record is reduced prior to the recording of said auxiliary information on said recording medium.

3. A method as in claim 2 wherein said second signal precedes said first signal whereby the intensity of the normal record is reduced subsequent to the recording of said auxiliary information on said recording medium.

4. A method as in claim 2 wherein the auxiliary information is in the form of numerical data and said step of changing the value of the stored data includes the step of counting down the stored numerical data, said step of detecting a first predetermined value includes detecting a first predetermined count of the stored numerical data and the step of detecting a second predetermined value includes detecting a second predetermined count of the stored numerical data.

5. A method as in claim 4 wherein said step of reducing the amplitude includes blanking said echo sounding signals.

6. A method as in claim 5 wherein the auxiliary information is in the form of numerical data and said step of changing the value of the stored data includes the step of counting down the stored numerical data, said step of detecting a first predetermined value includes detecting a first predetermined count of the stored numerical data and the step of detecting a second predetermined value includes detecting a second predetermined count of the stored numerical data.

7. A method as in claim 6 wherein said step of reducing the amplitude includes blanking said echo sounding signals.

8. Apparatus for controlling the recording of auxiliary information on a recording medium along with echo sounding signals, comprising:
   means for storing data representative of said auxiliary information, the value of said stored data being changed in response to control signals;
   first means for detecting a first predetermined value of the changed data in said means for storing and for generating a first signal indicative thereof;
   second means for detecting a second predetermined value of the changed data and for generating a second signal indicative thereof;
   means for generating a marking signal representative of said auxiliary information in response to said second signal;
   means for amplifying said marking signal and the echo sounding signals for recording;
   means for reducing the amplitude of the amplified echo sounding signals in response to said first signal; and
   means for restoring the amplitude of said echo sounding signals after a period determined by the interval between said first and second signals, whereby said marking signal is recorded on said recording medium and the normal record adjacent said marking signal provides a contrasting background thereto.

9. Apparatus as in claim 8 wherein said means for reducing the amplitude is a controllable resistor for shunting said echo sounding signals to ground.

10. Apparatus as in claim 8 wherein said means for generating is a monostable multivibrator having a predetermined time constant.

11. Apparatus as in claim 8 wherein said stored data is reduced in said means for storing by said control signals; said first means for detecting detects said first signal prior to said second means for detecting said second signal whereby the intensity of the normal record is reduced prior to the recording of said auxiliary information on the recording medium.

12. Apparatus as in claim 11 wherein the auxiliary information is in the form of numerical data and said means for storing includes an up/down counter, said means for detecting a first predetermined value detects a first predetermined numerical count in said up/down counter and the means for detecting a second predetermined value detects a second predetermined count in said up/down counter.

13. Apparatus as in claim 8 wherein said stored data is reduced in said means for storing by said control signals; said second means for detecting detects said second signal prior to said first means for detecting said first signal whereby the intensity of the normal record is reduced subsequent to the recording of said auxiliary information on the recording medium.

14. Apparatus as in claim 13 wherein the auxiliary information is in the form of numerical data and said means for storing includes an up/down counter, said means for detecting a first predetermined value detects a first predetermined numerical count in said up/down counter and the means for detecting a second predetermined value detects a second predetermined count in said up/down counter.

* * * * *